United States Patent [19]

McClelland, III et al.

[11] 3,943,498

[45] Mar. 9, 1976

[54] DIRECT INPUT PHOTOELECTRIC PULSE INITIATOR FOR METER TELEMETRY AND RECORDING SYSTEMS

[75] Inventors: Theodore M. McClelland, III; William P. Doby, both of Raleigh, N.C.

[73] Assignee: Westinghouse Electric Corporation, Pittsburgh, Pa.

[22] Filed: Sept. 26, 1974

[21] Appl. No.: 509,611

[52] U.S. Cl. ........ 340/206; 340/201 R; 346/14 MR; 360/41
[51] Int. Cl.² ........................................ G08C 19/16
[58] Field of Search ........ 340/188 R, 190, 203, 204, 340/201 P, 206; 346/14 MR

[56] References Cited
UNITED STATES PATENTS

| | | | |
|---|---|---|---|
| 3,083,357 | 3/1963 | Chapin et al. | 340/204 |
| 3,646,539 | 2/1972 | Becker | 340/203 |
| 3,686,634 | 8/1972 | Malchman et al. | 340/171 R |
| 3,742,472 | 6/1973 | Bryant et al. | 340/177 CA |

*Primary Examiner*—John W. Caldwell
*Assistant Examiner*—James J. Groody
*Attorney, Agent, or Firm*—R. W. Smith

[57] ABSTRACT

A completely solid state photoelectric pulse initiator for electric utility meter telemetry and recording systems includes a low power CMOS digital integrated circuit (I.C.) flip-flop output circuit for directly generating output pulses in response to the rate of rotation of a meter movement. A pulse rate dividing circuit is provided by a presettable divide-by-N CMOS digital I.C. in one preferred form for electronically varying the ratio of the output pulses relative to the input pulses. A simplified data magnetic recording receiver circuit is capable of being supplied recorder drive current directly from the Q and $\overline{Q}$ logic outputs of the output flip-flop to produce non-return-to-zero (NRZ) data pulse recording.

7 Claims, 8 Drawing Figures

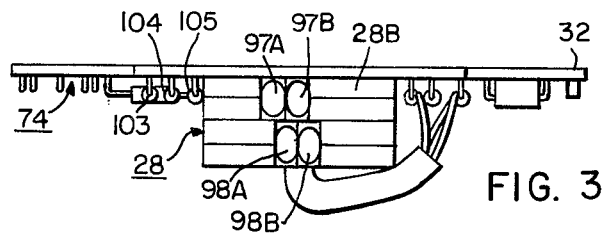
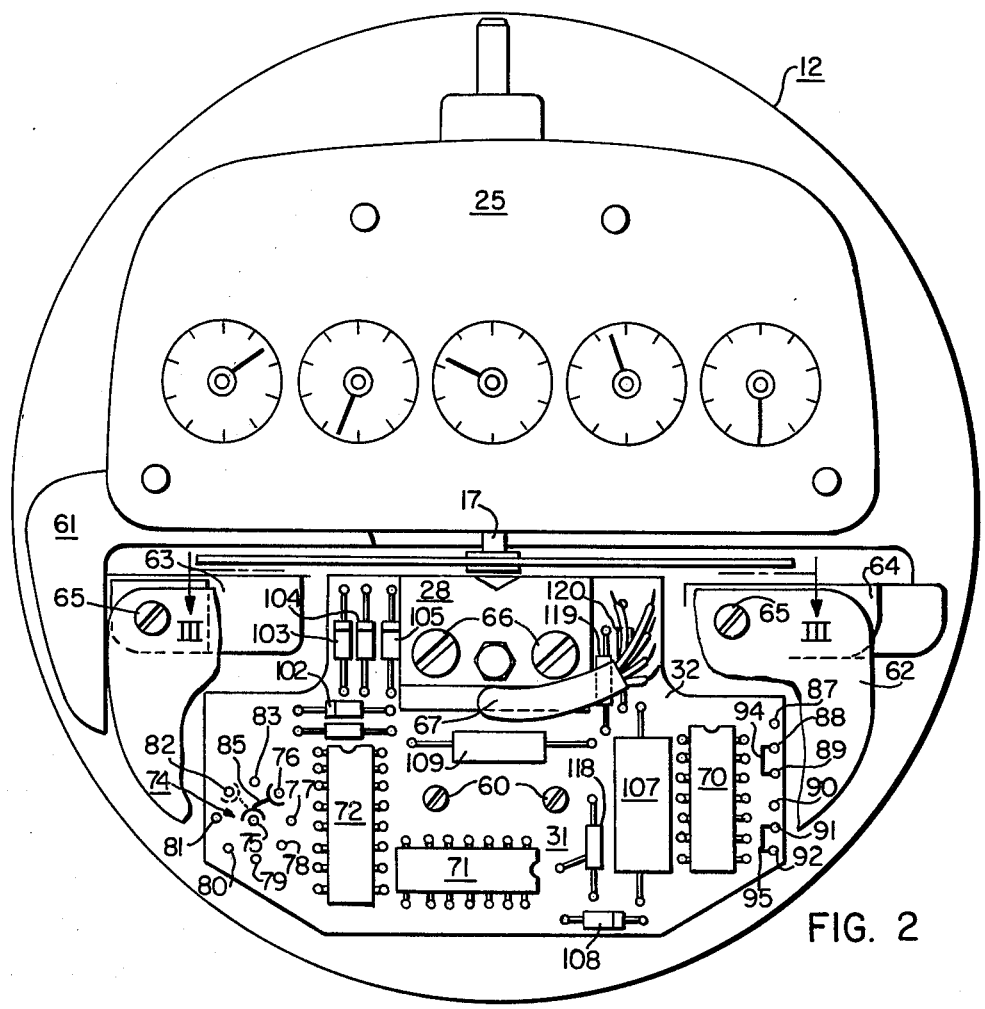

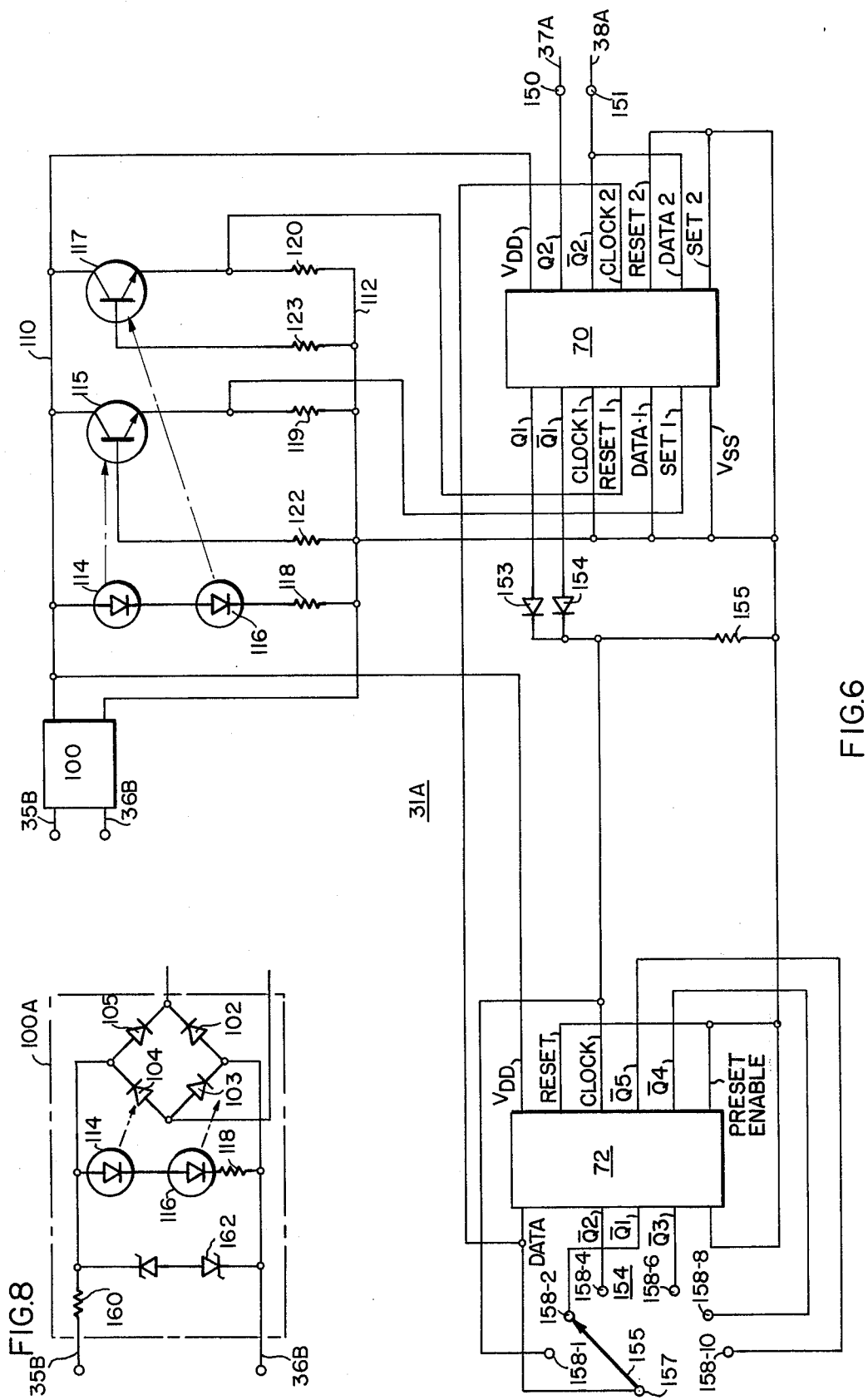

DIRECT INPUT PHOTOELECTRIC PULSE INITIATOR FOR METER TELEMETRY AND RECORDING SYSTEMS

BACKGROUND OF THE INVENTION

The invention relates to photoelectric pulse initiators for pulse operated meter telemetry and recording systems and more particularly to such pulse initiators including a low power digital I.C. arrangement for simplifying and controlling the transmitted pulses generated by the pulse initiator and to afford a simplified recording apparatus receiving the transmitted pulses.

In U.S. Pat. No. 3,733,493 issued May 15, 1973 to T. M. McClelland III and in U.S. Pat. No. 3,878,391 issued Apr. 15, 1975 to T. M. McClelland III et al., both assigned to the assignee of this invention, radiation or photoelectric pulse initiators are disclosed for use in the electric power metering field for initiating meter data pulses in response to the rate of rotation of a utility meter of the watthour type. In these prior systems various techniques are described for generating pulses in response to the meter rotation with an output pulse generator formed by a latching type three-wire contact device such as a mercury wetted relay. Large current values are sometimes required to adequately operate the relay in extremely cold environments and are typically inefficient. Since the relay effectively isolates the pulse initiator output and a data receiving recording circuit, separate power supply sources are required to supply both the pulse initiator circuits and the data recording circuits. Mechanical control for varying the pulse rate in response to the speed of the meter shaft movement, referred to as the constant Mp in the above-identified application, is not always satisfactory for all applications. Gear train ratios used in driving a patterned disk or drum in the pulse initiator mechanism or the number of reflective segments forming the indicia of the pulse initiator pattern often require substantial interchanging of parts and have limitations due to undesired loading of the meter shaft and space available within the meter housing. Ratios of less than one pulse per meter shaft rotation are often only possible by changing a gear train ratio while high output pulse numbers per shaft rotation are often only obtainable by increasing the number of reflective segments in the shaft driven pattern.

In the data magnetic recording systems used in utility meter recording telemetry systems it has been noted that watthour meter shaft speeds may reach as high as 6,670 revolutions per hour so that with two reflective segments over 13,000 pulses per hour might be produced from a pulse initiator while the data pulse receiver including a magnetic recorder may be capable of handling only 7,000 pulses per hour. This requires that the number of pulses developed at the radiation pickup sensors be divided to a lower rate proportional to the meter shaft speed.

Accordingly, it is desirable to simplify the components and numbers of components required to initiate and record meter data pulses in pulse initiators used in metering telemetry systems, to improve the reliability and adverse operating characteristics due to mechanical parts, to decrease power required in such telemetry systems, and to add greater flexibility in controlling the output pulse rates of pulse initiators to provide different desired pulse rates relative to a given watthour meter shaft rotation. In consideration of the aforementioned deficiencies and undesirable aspects in prior art devices the present invention is made as briefly summarized hereinafter.

BRIEF SUMMARY OF THE INVENTION

In accordance with the present invention a direct input photoelectric pulse initiator for metering telemetry and recording systems includes a low power CMOS digital integrated circuit flip-flop output arrangement which is toggled between high and low logic states at the Q and $\overline{Q}$ outputs. The logic states reverse in response to the alternate activations of radiation responsive source-pickup pairs being activated at the rate of rotation of a reflective pattern driven by a meter movement. The flip-flop output is effective to directly supply output current in opposite directions to a metering telemetry system receiver such as a magnetic recorder so that each output current polarity transitions are responsive to the detection of segments of the reflective pattern. A pulse rate dividing circuit is included in the pulse initiator circuit by connecting a low power CMOS digital integrated circuit presettable divide-by-N counter to a dual flip-flop CMOS digital integrated output circuit. A pulse division selector device is positional to produce various desirable pulse rates which are equal to or are a submultiple of the rate at which the reflective segments are detected. The direct connection with the recorder telemetry receiver permits elimination of switch contact devices between the pulse initiator circuit output and the elimination of separate recorder and pulse initiator power supply circuits to transfer pulse data information generated at the pulse initiator directly into the data recording circuit of a recorder data receiver.

Other advantages and features of this invention will be apparent from the detailed description of the preferred embodiments and the drawings which is briefly described hereinafter.

BRIEF DESCRIPTION OF THE DRAWINGS

FIG. 2 is a front elevational view of a watthour meter included in the apparatus illustrated in FIG. 1;

FIG. 3 is a top elevational view of a circuit board supporting the pulse initiator circuit and taken along the axis III—III in FIG. 2 looking in the direction of the arrows;

FIG. 6 is an electrical schematic diagram of an alternative embodiment of the diagram illustrated in FIG. 4;

FIG. 8 is an electrical schematic diagram of an alternative power supply portion for use in the electrical schematic diagrams illustrated in FIGS. 4, 6 and 7.

DESCRIPTION OF THE PREFERRED EMBODIMENTS

Figure 1:
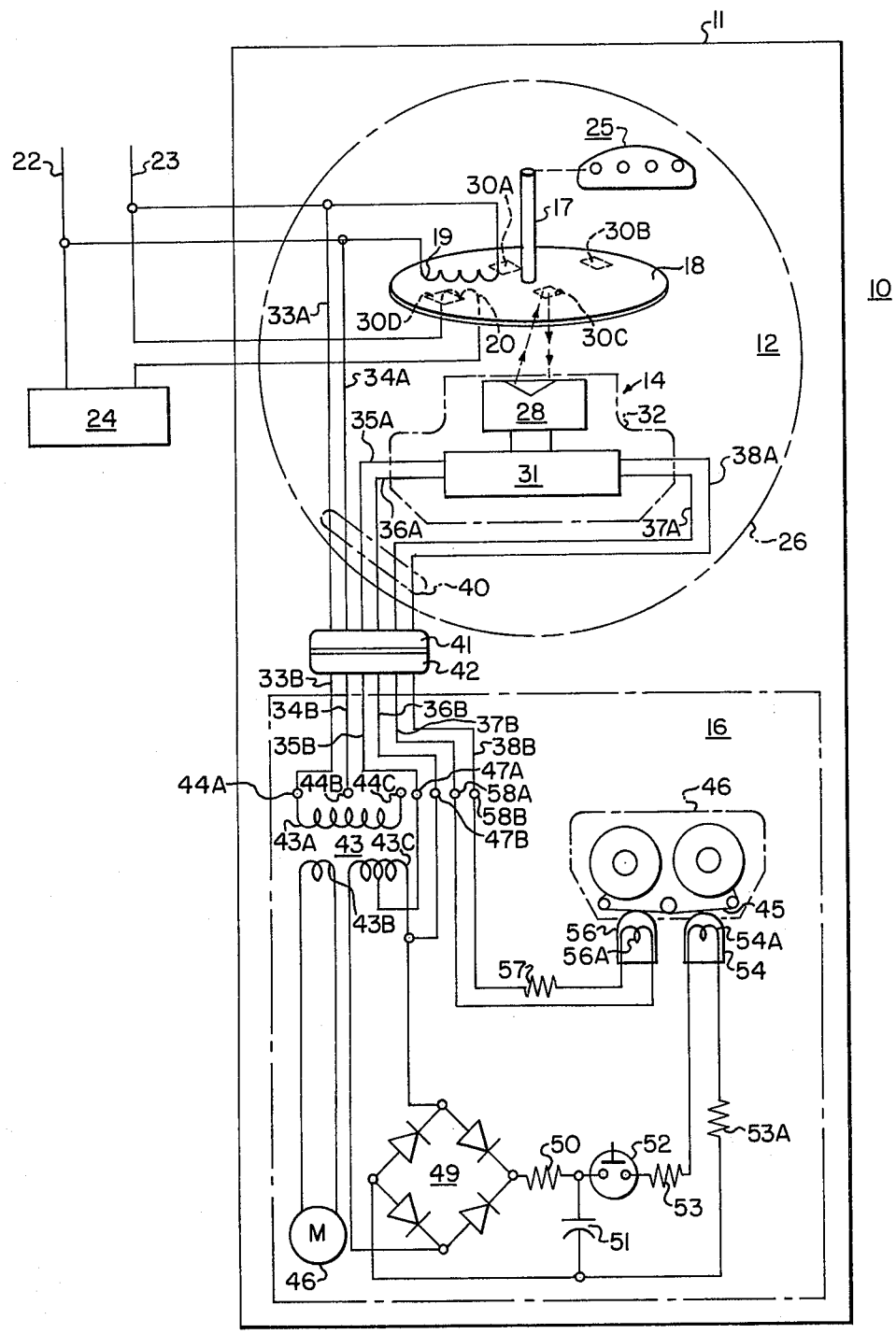
FIG. 1 is a schematic view of a meter data recording apparatus including a direct input photoelectric pulse initiator and made in accordance with this invention.

Referring now to the drawings wherein like numerals designate like or similar parts in the several Figures, and more particularly to FIG. 1 wherein is shown a metering data recording device 10 of a type referred to as a Load Survey Recorder although this invention is not limited to such telemetry receiver devices. The device 10 includes a housing 11 containing a watthour meter 12 forming one main unit thereof that has a direct input photoelectric pulse initiator 14. A magnetic tape data recorder 16 forms a second main unit of the device 10 and the pulse initiator 14 and the recorder 16 are described in particular detail hereinbelow.

The watthour meter 12 is of the integrating type used by electric utility companies including an electroresponsive meter movement having a rotatable shaft 17 for carrying an electroconductive disk 18 and electromagnetic sections including a potential coil 19 and a current coil 20. The coils 19 and 20 are appropriately connected to power line conductors 22 and 23 serving a utility customer's load 24 such that the disk 18 is electromagnetically driven at a predetermined rotational rate corresponding to the electrical energy supplied to the load 24. The meter 12 may, typically, include a dial register 25 for indicating the measured electrical energy consumption quantity in kilowatt hours. The meter 12 is removably mounted in the housing 11 to facilitate use of variously rated watthour meters corresponding to the electrical power levels to be measured and recorded. Preferably the watthour meter 12 is provided with a housing including a plastic meter cover 26 as described and claimed in U.S. Pat. No. 3,846,677 issued Nov. 5, 1974 to J. M. Keever et al. and assigned to the assignee of this invention.

The pulse initiator 14 is mounted to the frame of the watthour meter 12 in accordance with the description of FIG. 2 and generally includes a sensing head 28 including first and second photoelectric source-pickup pairs including solid state radiation emitter sources and a solid state radiation responsive transistor pairs. The source-pickup pairs are oriented to be alternately operated in response to a pattern of reflective indicia markings or segments 30A, 30B, 30C and 30D disposed on the bottom of the disk 18. The segments 30A and 30C are oriented on one common circumference of the disk to activate a first source-pickup pair and the segments 30B and 30D are oriented on a second common circumference of the disk 18 to activate a second source-pickup pair in a manner corresponding to that described in U.S. Pat. No. 3,733,493 issued May 15, 1973 to McClelland III and assigned to the assignee of this invention. The two source-pickup pairs are connected in the pulse initiator low power intergrated circuit (I.C.) circuit 31 mounted along with the sensing head 28 on a printed circuit board 32 shown in FIGS. 2 and 3.

A pair of wire conductors 33A and 34A are connected within the meter 12 to the electrical source provided by the power line conductors 22 and 23. Two further pairs of wire conductors 35A and 36A and 37A and 38A are connected to the circuit 31 of the photoelectric pulse initiator 14. These wire conductors 33A, 34A, 35A, 36A, 37A and 38A extend through an opening 40 in the plastic meter cover 26 and terminate at a connector 41. A connector 42 mates with the connector end 41 and is connected to wire conductors 33B, 34B, 35B, 36B, 37B and 38B which are connected through connectors 41 and 42 to the wire conductors 33A, 34A, 35A, 36A, 37A and 38A, respectively. The conductors 33A–33B and 34A–34B supply the pulse initiator circuit 31 from the power supply 43 in the recorder 16 as described further hereinbelow and the conductors 37A–37B and 38A–37B provide a direct input to the data recording circuit in the recorder 16 as described further hereinbelow.

The recorder 16 generally provides non-return-to-zero (NRZ) recording of data pulses and time interval pulses on a magnetic tape 45 carried in an insertable cartridge 46 as described and claimed in U.S. Pat. No. 3,678,484 issued July 18, 1972 to A. H. Maxwell, Jr. and assigned to the assignee of this invention. The tape is recorded for extended periods including a 1-month period for later data translation by computer processing. The power supply 43 includes a transformer having a primary winding 43A with outer and center tapped terminals 44A, 44B and 44C. These permit connection to power line conductor sources, from conductors 33A–33B and 34A–34B connected at two of the terminals 44A, 44B and 44C, being measured having either 120 or 240 volts. Two secondary windings 43B and 43C supply the recorder circuits as well as the pulse initiator circuit 31. The winding 43B supplies the timing motor 46. The center tapped secondary winding 43C has the outer terminals supplying 24 volts to the time interval recording circuit and has 12 volts between the center terminal and one outer terminal to supply the recorder terminals 47A and 47B. These latter designated terminals are connected through the conductors 35A–35B and 36A–36B to apply the 12 volts to the voltage supply input of the pulse initiator circuit 31.

The time interval recording circuit of the recorder 16 is connected to the power supply winding 43C and includes a full wave rectifier circuit 49, a resistor 50, a capacitor 51 and a cam operated switch 52 which is actuated in response to the motor 46. The switch 52 periodically discharges the capacitor 51 through resistor 53 and time interval magnetic record head 54 including a coil 54A. The tape drive (not shown) and time interval recording circuit is provided substantially in accordance with disclosures in the U.S. patent application Ser. Nos. 509,612 by W.P. Doby and 509,613 by C.J. Snyder et al. both filed on Sept. 26, 1974 and are assigned to the assignee of this invention. Accordingly, the discharge of capacitor 51 produces return-to-bias time pulses typically at 15, 30 or 60 minute intervals or at such other time intervals as may be desired, as described in the aforementioned patent applications.

In accordance with an important advantage of this invention, a simpler data recording circuit is provided in the recorder 16, by a data magnetic record head 56 having a coil 56A connected in series with a resistor 57 and across the recorder terminals 58A and 58B. The wire conductors 37A–37B and 38A–38B are connected to the terminals 58A and 58B, respectively, so as to provide a direct input of pulse initiator circuit 31 to the recording circuit including the data record head 56 in the recorder 16.

Figure 4:
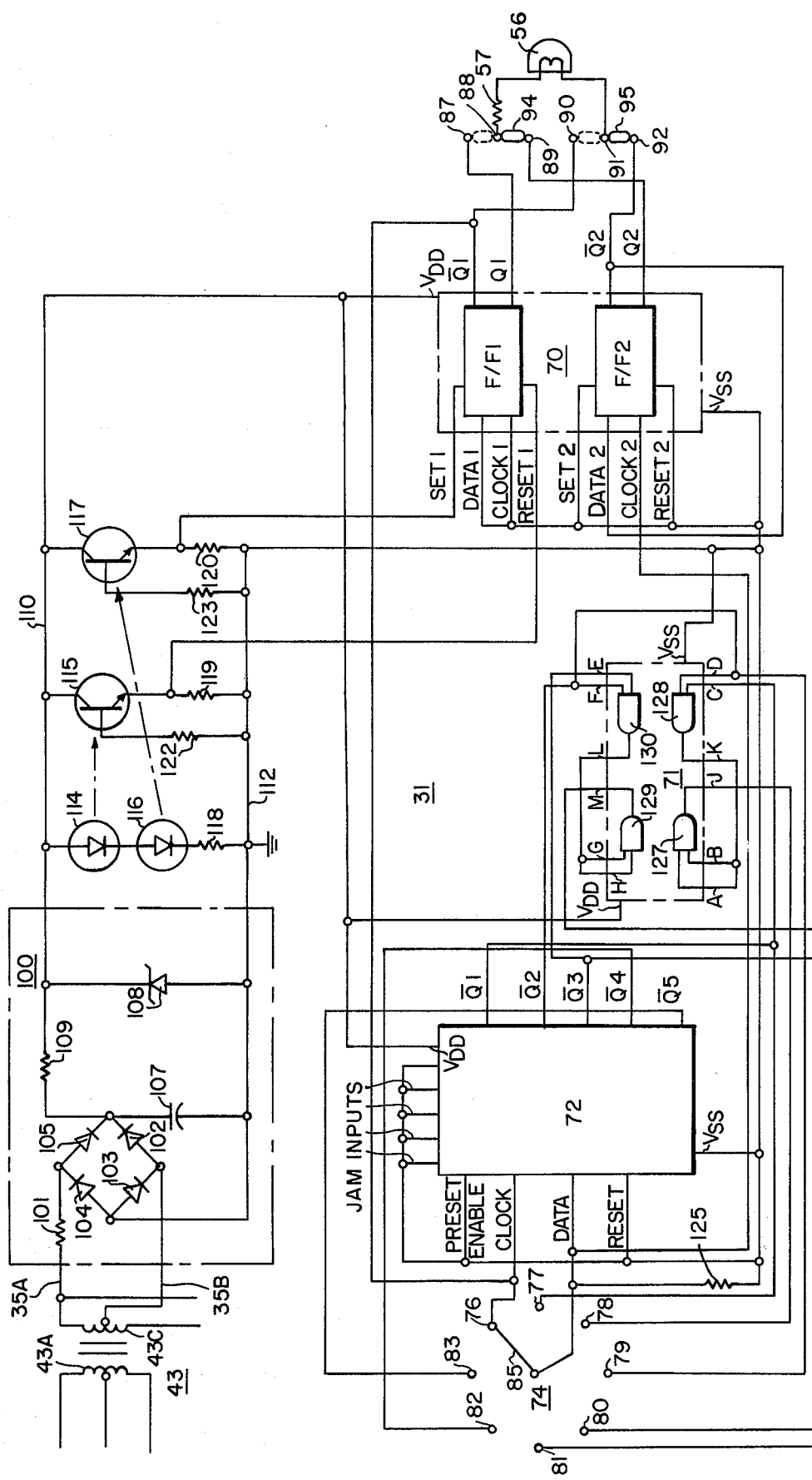
FIG. 4 is an electrical schematic diagram of the direct input photoelectric pulse initiator arrangement illustrated in FIG. 2.

In FIG. 2 there is shown the meter 12 separated from the metering data recording device 10 and the manner of mounting the pulse initiator circuit board 32. A pair of screws 60 secure the circuit board 32 to the meter frame 61 below the disk 18. The meter nameplate 62, shown broken away, is fastened to the ends of forward projecting bosses 63 and 64 of the frame 61 by a pair of screws 65 to substantially cover the front of the circuit board 32. The sensing head 28 is fastened to the board 32 by the screws and the two radiation emitter sources and two radiation responsive transistors, shown in FIG. 4 are connected to the circuit elements of the pulse initiator circuit 31 by the wiring arrangement 67. The discrete circuit elements shown mounted on the board 32 correspond to the elements having like numerical designation in circuit diagram in FIG. 4 described hereinbelow. Three low power solid state digital integrated circuit chip devices 70, 71 and 72 of the CMOS or COS/MOS (complementary metal oxide silicon) transistor type provide important advantages in the pulse initiator circuit 31.

At left-hand side of the circuit board 32 as viewed in FIG. 2 is a pulse division selector pin connector arrangement 74. A center pin 75 is circumscribed by eight pins 76, 77, 78, 79, 80, 81, 82 and 83. Although not shown, the pins designated 76 through 83 may be labeled "2," "4," "6," "8," "10," "12," "16" and "20," respectively, on the board 32 shown in FIG. 2 because these pins correspond to the 2:1, 4:1, 6:1, 8:1, 10:1, 12:1, 16:1 and 20:1 pulse rate division ratio provided by the pulse initiator circuit 31. To effect the different pulse ratios, a jumper connection 85 is made between center pin 75 and the selected one of the outer pins. For example, pin 76 is connected to pin 75, as shown in FIG. 2 to provide a two to one pulse rate ratio. The jumper connection 85 can be made by soldering a wire strip between the center pin 75 and a selected outer pin or the jumper connection 85 can be a wire having socket ends for mating with the ends of pins. Alternatively, the pulse division selector pin connector arrangement 74 can be replaced by a eight position rotary selector switch, not shown, to provide the same preselective connections. The conductors 35A and 36A, shown in FIGS. 1 and 4, are connected at the left side of the circuit board 32, although not shown in FIG. 2, to apply the supply voltage to the pulse initiator circuit 31.

At the right-hand side of the circuit board 32 shown in FIG. 2, there are two sets of three pins 87, 88 and 89 and 90, 91 and 92 which are also shown in FIG. 4. The pins 88 and 91 provide output pin terminals providing the pulse output of the pulse initiator circuit to the conductors 37A and 38A for direct connection to the data recording circuit in the recorder 16. Jumper wires 94 and 95 are connectable between the pins 88 and 87 and 91 and 90, respectively, to provide a 1:1 pulse division ratio output of the circuit 31 and wires 94 and 95 are connectible between the pins 88 and 89 and 91 and 92, respectively, to provide the pulse division ratio selected at the selector pin connector 74. Thus, the rate at which the reflective segments 30A, 30B, and 30C and 30D are detected by the devices in the sensing head 28 will be produced either at the same rate at the pins 88 and 91 or at the aforementioned pulse division ratios selected at the pin connector arrangement 74.

In FIG. 3 there is shown a top elevational view of the circuit board 32 separated from meter mounting shown in FIG. 2. The sensing head 28 includes two package assemblies 28A and 28B each including angularly disposed pairs of cavities 97A and 97B and 98A and 98B for directing the emitted and reflected radiations. The cavities aid in the optical coupling between each of the source-pickup pairs contained in separate ones of the assemblies 28A and 28B.

Referring now to FIG. 4 there is shown the electric circuit diagram of the direct input photoelectric pulse initiator circuit 31 carried on the circuit board 32 described hereinabove. The recorder power supply 43 is shown supplying, from the 12 volt secondary winding 45C and conductors 35A and 36A, the power input circuit 100 provides rectifying and voltage regulation for the pulse initiator circuit 31 on the circuit board 32. The resistor 101 is connected in one conductor line of a pair of lines connecting the power input conductors 35A and 36A across the input of a full wave rectifier bridge including conventional rectifier diodes 102, 103, 104 and 105. A filtering capacitor 107 and a Zener voltage regulating diode 108 are connected across the output of the rectifier bridge with a resistor 109 connected between the upper ends of the capacitor 107 and Zener diode 108 and in series with positive supply conductor 110 of the pulse initiator circuit 31. A regulated direct current voltage in the order of positive 7.5 VDC is produced on the supply conductor 110 relative to the reference supply conductor 112 which is grounded. The VDD supply voltages for the CMOS I.C. components 70, 71 and 72 are applied from the conductor 110 and the VSS voltages are applied from the conductor 112.

A first source-pickup pair included in the sensing head package assembly 28A shown in FIG. 3 includes a radiation emitter formed by the light emitting diode (LED) 114 and a radiation responsive pickup formed by a phototransistor 115. The LED 116 and phototransistor 117 are included in the second source-pickup pair contained in the sensing head package assembly 28B. The LED's 114 and 116 are connected in series with the resistor 118 and in series across the conductors 110 and 112 to be continuously lighted. The collector-emitter circuits of the phototransistor 115 and 117 have emitter connected resistors 119 and 120, respectively, connecting the collector-emitter circuits across the conductors 110 and 112. The bases of the phototransistors 115 and 117 have biasing resistors 122 and 123, respectively, connecting the bases to the ground reference conductor 112.

The output of the photoelectric pulse initiator circuit 31 is provided by the CMOS digital integrated circuit 70 which is a dual D-type flip-flop with set-reset capability designated CD4013AE as described at pages 68 through 73 in the RCA Solid State '74 Databook Series SSD-203B; COS/MOS Digital Integrated Circuits available from RCA Solid State Division, Somerville, N.J. Two identical data-type flip-flop circuits F/F1 and F/F2 have independent DATA, SET, RESET, and CLOCK inputs and Q and $\bar{Q}$ outputs as shown in FIG. 4. The logic level present at the DATA input of each flip-flop is transferred to the associated Q output during the positive-going transition of a pulse of the associated Clock input. The flip-flops provide a latching operation by remaining in either the high or low state until a subsequent trigger pulse is applied. High levels on the SET or RESET inputs accomplish setting and resetting of the flip-flops F/F1 and F/F2.

The Q1 and $\bar{Q}$1 outputs of the flip-flop F/F1 are connected to the circuit board pins 87 and 90 respectively and the Q2 and $\bar{Q}$2 outputs of the flip-flop F/F2 are connected to the pins 89 and 92. Depending upon the position of the aforementioned jumpers 94 and 95 the meter data pulse output conductors 37A and 38A directly connect the data magnetic record head 56 to the Q and $\bar{Q}$ outputs of one of the flip-flops F/F1 or

F/F2.

It is an important feature of the present invention that the integrated circuits 70, 71 and 72 are of the low power CMOS integrated circuit type to be distinguished from the medium or relative high power solid state integrated circuit types including the common logic names of resistor-transistor-logic (RTL), diode-transistor logic (DTL), transistor-transistor-logic (TTL) and emitter-coupled logic (ECL). These logic families operate at high operating quiescent current requirements in the order of 60 milliamperes and quiescent power requirements in the order of 200 milliwatts. In contrast the substantially lower requirements of the CMOS integrated circuits include operating quiescent current levels in the order of 10 microamperes and quiescent power requirements of only 100 microwatts.

Referring now in more detail to the circuit 31 shown in FIG. 4 and in particular to the dual flip-flop circuit 70, the SET 1 input to the flip-flop F/F1 is connected across the emitter resistor 120 of the phototransistor 117 so that when a reflective disk segment is detected by rendering the phototransistor 117 conductive so that a high level logic is applied to the SET 1 input. The RESET 1 input is similarly connected across the emitter resistor 119 so that when the phototransistor 115 is rendered conductive, upon detecting a reflective segment, a high logic state is applied to the RESET 1 input. The CLOCK 1, SET 2 and RESET 2 inputs are not used and are connected to the grounded supply conductor 112 along with the VSS terminal of the I.C. circuit 70. The DATA 2 input is connected to the $\overline{Q2}$ output. The VDD terminal of the circuit 70 is connected to the supply conductor 110 as shown. With above connection, the Q1 and $\overline{Q1}$ outputs develop a transition between high and low logic states to reverse current through the record head 56. When the jumpers 94 and 95 are connected in the broken line position to the pins 87 and 90, the circuit 31 produces a 1:1 pulse ratio at the pulse intiator circuit output because the pulse dividing part of the circuit 72, described hereinafter, is bypassed.

To produce the divide-by-N operation of the circuit 31 the CMOS digital integrated circuit 72 is a presettable divide-by-N counter type CD4018 described at pages 95 through 99 of the above-identified RCA Solid State '74 Databook Series SSD-203B. The circuit provides a programmable divide by counter function when connected to the integrated circuits 70 and 71 as shown. The CMOS digital integrated circuit 71 is a CMOS NAND gate (positive logic) Quad two input type CD4011AD also described in the aforementioned RCA Solid State '74 Databook Series SSD-203B at pages 61 through 67.

The divide-by-N-counter circuit 72 includes five JAM inputs PRESET ENABLE, VSS terminal and RESET INPUTS connected to ground. The DATA input is connected through a resistor 125 to ground and is also connected to the center pin 75 of the pulse division selector arrangement 74 and further to the CLOCK 2 input of the flip-flop circuit F/F2. The CLOCK input to the circuit 72 is connected directly to the divide by 2 pin 76 and to the $\overline{Q1}$ output of the flip-flop F/F1. Since the circuit 72 only advances counting with the low to high transitions at the CLOCK input, the connection from the $\overline{Q1}$ provides a divide by two function inherently from this connection to the circuit 72. Thus, a single CLOCK logic signal to the circuit occurs for each two reflective segments which are detected. Accordingly, the $\overline{Q1}$ output of the circuit 72 is connected to the divide by 4 pin 77 since it normally produces a divide two counter output. The two input NAND gates 127 and 128 of the circuit 71 are required to achieve the divide by 6 output at pin 78 and the NAND gates 129 and 130 are required for the divide by 10 output at pin 80 since they involve division by the product of numbers including an odd number (2×3 and 2×5). The gates 127 and 129 have their inputs A and B and H and G separately tied together to operate as an inverter circuit and provide the connection described on page 98 of the above identified RCA Solid Stage '74 Databook Series. Accordingly, the output K of the gate 127 is connected to the divide 6 output at pin 78 with the short circuit inputs A and B of the gate 127 connected to the output K of the gate 128. The inputs C and D of the gate 128 are connected to the $\overline{Q1}$ and $\overline{Q2}$ of the circuit 72. The $\overline{Q2}$ of the circuit 72 is the normal divide by two counter output and is connected to the divide by 8 pin 79. The gate 130 inputs F and E are connected to the $\overline{Q2}$ and $\overline{Q3}$ outputs of the circuit 72. The output L of the gate 130 is connected to the short circuited inputs H and G of the gate 129 and the output M of the gate 129 is connected to the divide by 10 pin 80. The divide by 12, 16 and 20 pins 81, 82 and 83 are connected directly to the $\overline{Q3}$, $\overline{Q4}$ and $\overline{Q5}$ outputs of the circuit 72 since they are programmed to divide the count input to the circuit normally by 6, 8 and 10.

Thus described, the photoelectric pulse initiator circuit 31 is responsive to the rotation of the meter shaft 17 and disk 18 rotating at a rate corresponding to consumption of electric power of the load 24. The alternate or staggered relationship of the reflective segments 30A, 30B, 30C and 30D, shown in FIG. 1, pass the sensing head 28 to alternating activate the phototransistor detectors 115 and 117 by rendering or switching them conductive four times with each complete meter shaft rotation. This develops a short low to high or positive going pulse signals across the resistors 119 and 120 which form the input signals in the pulse initiator circuit 31. The alternate positive going input signals to the SET 1 and RESET 1 inputs of the flip-flop F/F1 toggle or switch the flip-flop so that Q1 and $\overline{Q1}$ output go between low to high and high to low logic states alternately and remain latched in this state until the next appropriate set or reset signal is received. It is important to note that Q and $\overline{Q}$ outputs of the flip-flop circuits in the circuit 70 characteristically never both go high during the same instant so that one flip-flop output goes low before the other goes high. Positive going transitions at the CLOCK input at the presettable divide-by-N-counter circuit 72 advance the circuit count. The $\overline{Q1}$, $\overline{Q2}$, $\overline{Q3}$, $\overline{Q4}$, $\overline{Q5}$ of circuit 72 produce divide by 2, 4, 6, 8 and 10. The connections at the circuit 71 produce or the additional divide by three and five logic operation. The $\overline{Q1}$ output of the flip-flop F/F1 will only go high once for each two input pulses developed by the phototransistors 115 and 117. The circuit 31 then provides a product of two pulse counter dividing operations so that setting of the pulse division selector arrangement 74 produces either of divide by 2, 4, 6, 8, 10, 12, 16 or 20 at the outputs of the flip-flop F/F2. This is produced as the DATA output of circuit 72 goes from low to high at the CLOCK 2 input of flip-flop F/F2. Thus, with the selector arrangement 74 connected to pin 76 to be set at divide by 2, two transitions between low and high occur with a complete rotation of the four disk segments. Since the flip-flop F/F1 is toggled or triggered when each disk reflective segment is detected, a one-to-one pulse transition output is produced at the Q1 and $\overline{Q}2$ outputs of the flip-flop F/F1. The Q2 and $\overline{Q}2$ outputs of flip-flop F/F2 provide the preselected pulse rate ratio as established by the position of the pulse division selector 74 as noted hereinabove.

Figures 5, 7:
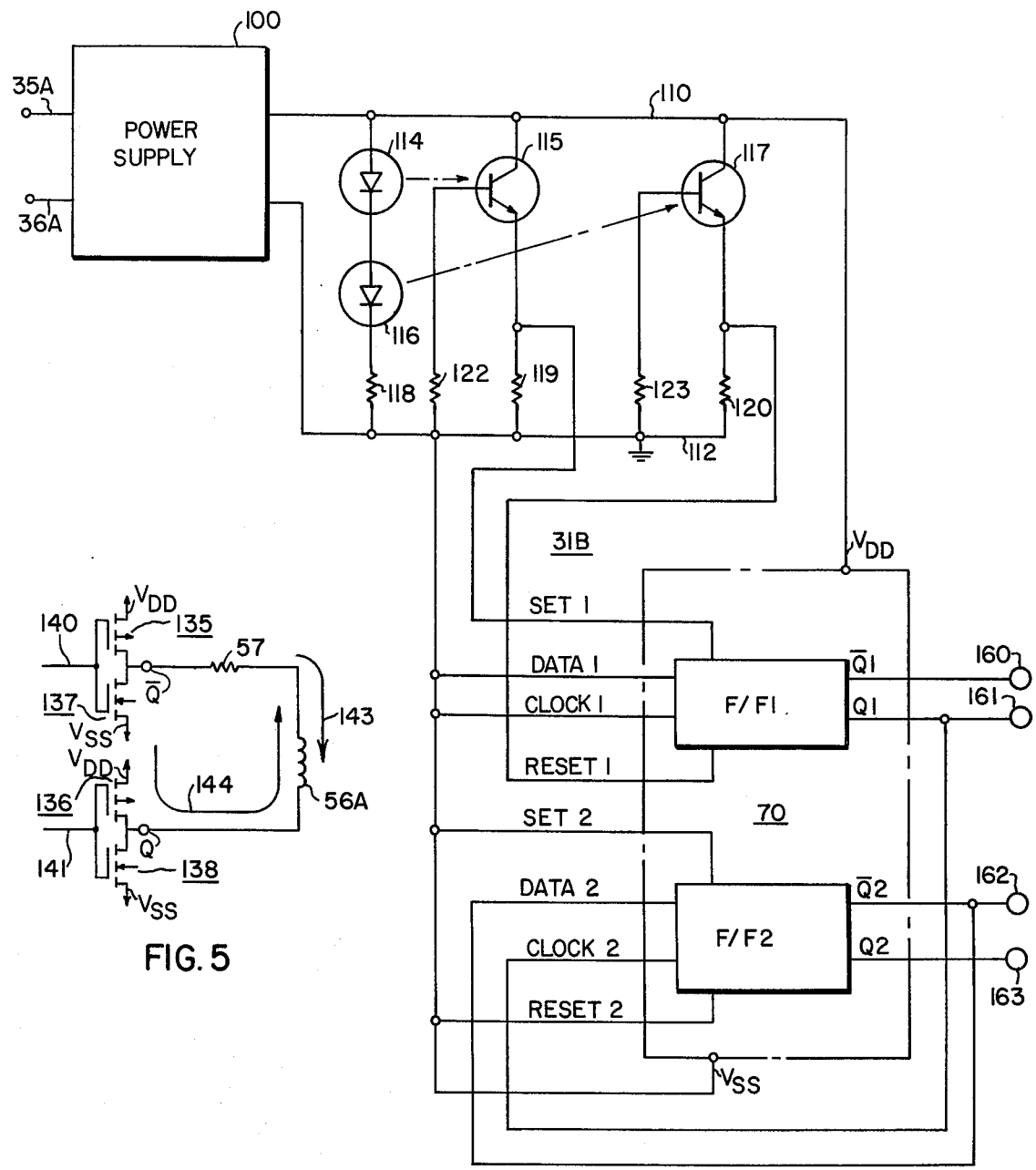
FIG. 5 is a fragmentary portion of the electrical schematic diagram of FIG. 4 illustrating CMOS integrated circuit transistor devices provided at the circuit output of FIG. 4.
FIG. 7 is an electrical schematic diagram of another alternative embodiment of the diagram illustrated in FIG. 4.

FIG. 5 illustrates CMOS transistor devices forming the output of each of the flip-flops F/F1 and F/F2. Each output consists of p-channel insulated gate field effect transistors 135 and 136 and n-channel insulated-gate field effect transistors 137 and 138. The pair of p-channel and n-channel transistors 135 and 137 are connected in series and the pair of transistors 136 and 137 are connected in series with each pair being connected between the VDD and VSS terminals. The junction of each series transistor pair provides the Q and $\overline{Q}$ outputs as shown with the gates connected together to provide the two inputs 140 and 141 of each transistor pair. When $\overline{Q}$ is high and Q is low, transistors 135 and 137 are latched conductive and transistors 136 and 138 are latched nonconductive. Positive current flows in the direction of the arrow 143 through the resistor 57 and recording head coil 56A between VDD and VSS. The current flows in the opposite direction as shown by arrow 144 when the transistor has reversed conductive states to render the Q output high relative to the $\overline{Q}$ output. The data recording current flow represented by arrows 143 and 144 is in the order of 2 milliamperes in one preferred embodiment. The current values can be easily adjusted by changing the value of the resistor 57. The very high impedance of the nonconductive CMOS transistor is in the high megohm resistance range which makes its quiescent power drain quite low. The source to drain impedance of the conductive transistors is low but is a finite resistance value in the range of a hundred ohms. Thus, the pulse initiator circuit output can be used with different recorders having different record drive current requirements up to about 5 ma.

In the operation of the recorder 16 shown in FIG. 1, the Q and $\overline{Q}$ outputs of the circuit 70 of FIG. 4 produce continuous current flow in the data record head 56 with a change in current polarity with change in state at the selected Q and $\overline{Q}$ outputs applied to the recorder terminals 58A and 58B by pulse current supplied from the pulse initiator circuit 31. Magnetically recorded data pulses are recorded on the magnetic tape in a NRZ fashion. The data pulse recording is in the same manner as with the prior use of a three-wire contact device which requires the data record head current to be supplied from within the recorder 16. Time interval pulses are recorded concurrently in a separate recording track on the tape 45 by the time interval record head 54 as noted hereinabove. Accordingly, power is supplied from the meter 12 through the wiring and connectors 41 and 42 to the recorder terminals 44A and 44B or 44C so that the recorder supplies the recorder circuits. The pulse initiator circuit 31 is supplied as well from the recorder 16 back through the wiring and connectors 41 and 42 from the recorder terminals 47A and 47B.

In FIG. 6 there is shown an alternative photoelectric pulse initiator circuit 31A intended to replace the photoelectric pulse initiator circuit 31 illustrated in FIG. 4 and mounted in the meter 12 as shown for the circuit 31. The same power supply portion 100 and LED radiation emitters 114 and 116 and phototransistors 115 and 117 are connected together and are provided in the sensing head 28 as described hereinabove. The same dual D type flip-flop digital integrated circuit 70 and presettable divide-by-N counter digital integrated circuit 72 are used as described for the pulse initiator circuit 31 with connections as shown in FIG. 6. The digital integrated circuit 71 of the circuit 31 is not used to reduce the cost and produce a different pulse dividing operation in the circuit 31A. The RESET 1 and SET 1 inputs to the circuit are connected to the phototransistors 117 and 115 to toggle the flip-flop outputs Q1 and $\overline{Q}1$ each time a phototransistor is switched conductive. The Q2 and $\overline{Q}2$ outputs of the flip-flop circuit 70 provides preselectable pulse division ratios at the output terminals 150 and 151. The conductors 37A and 37B provide the two-wire pulse initiator output as for the circuit 31. Common polarity ends of conventional diodes 153 and 154 are connected with the polarity shown to the Q and Q1 outputs of the circuit 70. The opposite common polarity ends of the semiconductor diodes 153 and 154 are connected together and through a resistor 155 to the grounded supply conductor 112 and also to the CLOCK input of the circuit 72. The diode connections uniquely produce a low to high pulse transition at the CLOCK input of the circuit 72 with change in the logic states of Q1 and $\overline{Q}1$. In effect, the diodes double the frequency of the low to high transitions normally occurring at either of the Q1 or $\overline{Q}1$ outputs. The junction capacitances of the diodes 153 and 154 and the value of the resistor 155 assure that the required time spacing between consecutive low to high transitions is provided and also that the minimum CLOCK input pulse width is provided. The DATA input is connected to the CLOCK 2 input. The circuit 72 is programmed to divide the low to high pulse transitions from the diodes 153 and 154 so that divide by 2, 4, 6, 8 and 10 operations occur at the $\overline{Q}1, \overline{Q}2, \overline{Q}3, \overline{Q}4$ and $\overline{Q}5$ outputs, respectively.

To preselect the desired pulse dividing ratio to be established at the terminals 150 and 151 a pulse division selector multiple contact switch arrangement 154 is provided. A rotary switch arm 155 is positional to connect the switch common input terminal 156 with one of the switch terminals 158-1, 158-2, 158-4, 158-6, 158-8 and 158-10 which correspond to the divide by 1, 2, 4, 6, 8 and 10 when the terminals 157, 158-1, 158-2, 158-4, 158-6, 158-8 and 158-10 are connected to the DATA input, CLOCK input, $\overline{Q}1, \overline{Q}2, \overline{Q}3, \overline{Q}4$ and $\overline{Q}5$ outputs of the circuit 72, respectively.

FIG. 8 illustrates an alternative power input circuit 100A intended to replace the circuit 100 shown in FIGS. 4, 6 and 7. The LED's 114 and 116 are connected between the 12 volt AC input supplied by the conductors 35B and 36B and the same full wave rectifier bridge included in the power input circuit 100. Oppositely poled series connected Zener diodes 161 and 162 are connected across the series connected LED's 114 and 116 and the aforementioned resistor 118 so that the LED's are lighted only during the positive half cycle of the current occurring across the conductors 35B and 36B. This aids in extending the operating life of the LED's 114 and 116.

In FIG. 7 there is shown a further alternative embodiment of a pulse initiator circuit 31B intended to replace the circuit 31 as described hereinabove when either the output pulse rate of the pulse initiator may be equal to or one-half the input pulse rate from the phototransistors 115 and 117. In the circuit 31B only the dual D type flip-flop digital integrated circuit 70 is used and is the same type as described for the circuit 70 shown in FIG. 4 including the two flip-flops F/F1 and F/F2. The Q1 and $\overline{Q}$1 outputs are connected to the circuit output terminals 160 and 161 and the Q2 and $\overline{Q}$2 outputs are connected to the circuit output terminals 162 and 163. The conductors 37A and 38A are connectable to the pair of output terminals 160 and 161 or to the pair of output terminals 162 and 163 to provide either a divide by 1 or divide by 2 output to the recorder as described hereinabove for the circuits 31 and 31A.

The SET 1 input and RESET 1 input are connected to the phototransistor 115 and 117. The Q1 output is connected to the CLOCK 2 input and $\overline{Q}$2 output is connected to the DATA 2 input. The DATA 1, CLOCK 1, SET 2 and RESET 2 are all connected together and to the grounded supply conductor 112. The direct input photoelectric pulse initiator circuit 31B provides all the advantages and lower cost of the photoelectric pulse initiator circuits 31 and 31A where the additional advantage of preselectable output pulse ratios are not required.

While the embodiments of the direct input photoelectric pulse initiator and the pulse initiator and recorder pulse telemetry receiver described hereinabove for metering telemetry and recorder systems constitute preferred embodiments of this invention it is contemplated that modifications and substitution of equivalent parts may be within the spirit and scope of this invention.

We claim:

1. A photoelectric pulse initiator for a meter telemetry system transmitting metering data from a rotatable meter movement rotated at a rate related to a measured electric power quantity, comprising: a power supply circuit including a rectifier means connectible to a source of alternating current to establish a source of direct current therein; first and second radiation source-pickup pairs connected to said power supply circuit, each of said first and second pairs including a solid state radiation emitter source and a solid state radiation responsive pickup, said radiation responsive pickups being alternately activated by reflected radiations from said sources at a rate responsive to the rate of rotation of the meter movement; a low power solid state digital integrated circuit flip-flop circuit supplied from said source of direct current in said power supply circuit, said flip-flop circuit including one flip-flop means including one SET and one RESET inputs and one Q and one $\overline{Q}$ logic outputs, said one SET and one RESET inputs being separately connected to separate ones of said radiation responsive pickups, said one Q and one $\overline{Q}$ outputs having alternately latched high and low logic states in response to said alternate activation of said radiation responsive pickups; and output means including first and second terminal means connected to said one Q and said one $\overline{Q}$ outputs, said output means being connectible to a data receiver means of the telemetry system such that continuous current pulses having either of opposite directions are supplied from said source of direct current to said output means in accordance with said alternate high and low logic states at said one Q and one $\overline{Q}$ outputs.

2. A photoelectric pulse initiator as claimed in claim 1 wherein said low power solid state digital integrated circuit flip-flop circuit includes a second flip-flop means including second DATA and second CLOCK inputs and second Q and second $\overline{Q}$ outputs of said flip-flop circuit, said second DATA input being connected to one of the second Q and second $\overline{Q}$ outputs of said second flip-flop means and said second CLOCK input being connected to one of said one Q and one $\overline{Q}$ outputs of said one flip-flop means so that said second Q and second $\overline{Q}$ outputs of said second flip-flop means are alternately latched once at high and low logic states for every two alternate latching of said one Q and one $\overline{Q}$ outputs of said one flip-flop circuit means; and wherein said output means includes third and fourth terminal means directly connected to said second Q and second $\overline{Q}$ outputs and, wherein both said first and second terminal means and said third and fourth terminal means are selectively connectible to said receiver means of said telemetry system.

3. A pulse initiator circuit as claimed in claim 1 wherein said low power solid state digital integrated circuit flip-flop circuit includes a second flip-flop having associated second DATA and second CLOCK inputs and second Q and $\overline{Q}$ outputs with said second CLOCK input being connected to said second $\overline{Q}$ output, and wherein said pulse initiator further includes a low power solid state digital integrated circuit divide by N counter circuit including DATA and CLOCK inputs and plural $\overline{Q}$ outputs, said counter circuit DATA and CLOCK inputs being connected to said second CLOCK input and said one Q1 output respectively; and wherein said pulse initiator further includes a pulse division selector means having plural terminal means each being connected to a different one of said counter circuit $\overline{Q}$ outputs and said pulse division selector means further having a common terminal connected to said counter circuit DATA input and selectively connectable to one of said plural terminal means for presetting said counter circuit a different count divisions, and wherein said output means includes third and fourth terminal means directly connected to said second Q and second $\overline{Q}$ outputs and wherein both said first and second terminal means and said third and fourth terminal means are selectively connectible to said receiver means of said telemetry system such that said continuous current pulses are generated at said third and fourth terminal means at a preselected rate which is a submultiple of said rate at which the pickups are activated.

4. A photoelectric pulse initiator as claimed in claim 3 including a low power solid state digital integrated circuit including plural two input NAND gates, said inputs of each NAND gate being connected to two different ones of said counter circuit $\overline{Q}$ outputs and the output of each NAND gate being connected to one of said plural terminal means of said pulse division selector means for producing further counter count divisions.

5. A photoelectric pulse initiator as claimed in claim 3 wherein one of said one $\overline{Q}$ and Q outputs of said flip-flop circuit means and said CLOCK input of said counter circuit are connected to one of said terminal means of said pulse division selector means for producing a current pulse output at said one Q and one $\overline{Q}$ output which have the same pulse rate as said rate at which said radiation responsive pickups are activated.

6. In a meter telemetry system for transmitting pulse information from an electric meter including a rotatable meter movement rotated at a rate related to an electric power quantity measured by said meter, the combination comprising: a reflection pattern means rotatable in response to the rate of rotation of the meter movement; a photoelectric pulse initiator circuit including first and second radiation source-pickup pairs, each of said first and second pairs including a solid state radiation emitter source and a solid state radiation responsive pickup, said pickups being alternately activated at a rate responsive to the rate at which radiations are coupled between said emitter source and said pickup by rotation of the reflective pattern means, said pulse initiator further including a power input circuit including a rectifier for developing a source of a direct current from an alternating current applied to said power input, a low power solid state digital integrated circuit means supplied by said source of direct current, said integrated circuit means including a flip-flop circuit including SET and RESET inputs alternately responsive to said alternate activation of said pickups of said first and second source-pickup pairs, and further including Q and $\overline{Q}$ logic outputs having alternately high and low logic states in response to the alternate inputs to said SET and RESET inputs, and output means including a pair of terminals connected to said Q and $\overline{Q}$ outputs for developing continuous opposite polarity current data pulses each having a predetermined polarity responsive to said high and low logic states of said Q and $\overline{Q}$ outputs, and a recorder telemetry receiver means including a two-wire recorder circuit including an electrical recording means, said receiver means including an alternating current power supply circuit energized by said electric power measured by said electric meter, said alternating current power supply having an output connected to said power input circuit of said pulse initiator for applying the alternating current thereto; and conductor means connecting said pair of terminals of said output means of said pulse initiator circuit to an input to said two wire recorder circuit to energize said recording means by said opposite polarity current pulses to effect data recording of said pulses.

7. In a meter telemetry system as claimed in claim 6 wherein said recorder telemetry receiver means is a magnetic recorder and said electrical recording means includes a magnetic record head for generating non-return-to-zero data record pulses in response to said opposite polarity current data pulses.

\* \* \* \* \*